(12) United States Patent
Sung

(10) Patent No.: US 7,721,790 B2
(45) Date of Patent: May 25, 2010

(54) HEAT SINK

(75) Inventor: Ching-Chun Sung, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 876 days.

(21) Appl. No.: 11/309,933

(22) Filed: Oct. 31, 2006

(65) Prior Publication Data

US 2008/0101028 A1 May 1, 2008

(51) Int. Cl.
*F28F 7/00* (2006.01)
(52) U.S. Cl. .................. 165/80.3; 165/185; 165/79; 361/697; 361/704; 174/16.3; 257/722
(58) Field of Classification Search ............. 165/80.3, 165/185, 78, 79; 361/703, 697, 704; 257/722; 174/16.3
See application file for complete search history.

(56) References Cited

U.S. PATENT DOCUMENTS

| | | | | |
|---|---|---|---|---|
| 6,474,407 B1 * | 11/2002 | Chang et al. | ............... | 165/80.3 |
| 6,607,023 B2 | 8/2003 | Ho et al. | | |
| 6,754,079 B1 * | 6/2004 | Chang | .................. | 361/709 |
| 6,765,799 B1 * | 7/2004 | Huang | .................. | 361/709 |
| 6,772,828 B1 * | 8/2004 | Chen | .................. | 165/78 |
| 6,883,591 B2 * | 4/2005 | Lai | .................. | 165/78 |
| 6,942,026 B2 * | 9/2005 | Lin et al. | .................. | 165/185 |
| 6,955,214 B2 * | 10/2005 | Wang | .................. | 165/104.33 |
| 6,995,981 B2 * | 2/2006 | Huang et al. | .................. | 361/703 |
| 7,025,122 B2 * | 4/2006 | You-Tien | .................. | 165/80.3 |
| 7,032,650 B1 * | 4/2006 | Tian | .................. | 165/80.3 |
| 7,044,197 B2 * | 5/2006 | Lee et al. | .................. | 165/80.3 |
| 7,121,326 B2 * | 10/2006 | Lee et al. | .................. | 165/80.3 |
| 7,163,049 B2 * | 1/2007 | Zhong et al. | .................. | 165/80.3 |
| 7,165,601 B1 * | 1/2007 | Hashimoto | .................. | 165/78 |
| 7,174,955 B2 * | 2/2007 | Zhong et al. | .................. | 165/185 |
| 7,461,686 B2 * | 12/2008 | Fan Chiang | .................. | 165/78 |

FOREIGN PATENT DOCUMENTS

CN 20040000145.3 1/2005

* cited by examiner

*Primary Examiner*—Terrell L Mckinnon
(74) *Attorney, Agent, or Firm*—Jeffrey T. Knapp

(57) ABSTRACT

A heat sink (100) includes a plurality of metal fins (10) interlocked with each other by interlocking units (11) formed between them. The interlocking units each include a protruding finger (122), a hole (114) and a controlling member (116, 117). The protruding finger, the hole and the controlling member are aligned with each other. The protruding finger includes a connecting tab (112*a*) which extends from a flange (14) of the metal fin and a locking tab (112*b*) which is curved inwardly from the connecting tab towards a main plate (12) of the metal fin. The locking tab of a rear metal fin extends into the hole of a front metal fin and fittingly abuts with the controlling member of the front metal fin so as to firmly interlock the rear and front metal fins together.

15 Claims, 11 Drawing Sheets

HEAT SINK

FIELD OF THE INVENTION

The present invention relates generally to a cooling device, and more particularly to a heat sink which can be suitably used for dissipating heat from heat generating electronic components, wherein the heat sink has a plurality of metal fins combined with each other by interlocking units formed between these metal fins.

DESCRIPTION OF RELATED ART

It is well known that electronic components such as central processing units (CPUs) of computers generate a large amount of heat during operation. In order to remove the heat generated by the CPU quickly, a cooling device such as a heat sink is generally used to dissipate the heat. Typically, the heat sink includes a plurality of metal fins which are disposed in parallel with each other.

In earlier day, a heat sink generally includes a flat base and a plurality of metal fins integrally formed with and extending upwardly from the base. The heat sink is typically an aluminum heat sink and is manufactured by an extrusion process. It is well known by those skilled in the art that, if the heat sink is integrally formed by an extrusion process, the metal fins of the heat sink cannot be made to have a large enough surface area available for heat dissipation. For example, a height of each of the metal fins and a spacing between every two of the metal fins are seriously restricted in the extrusion process.

Presently, most of the heat sinks are not an integral one. The metal fins of the heat sink are manufactured separately and then combined with each other by interlocking units formed between them. In this regard, a few manufacturing limits are placed on the metal fins of the heat sink. The interlocking units each may include a hook extending from the metal fin and a hole defined in the metal fin. The hook of a rear metal fin extends into the hole of a front metal fin and engages with a main plate of the front metal fin, thus combining the rear and front metal fins together.

In the above heat sink, the rear and front metal fins are combined by the engagement between the hook of the rear metal fin and the main plate of the front metal fin. However, the hook generally has a relatively small contact surface with the main plate and is a deformable element by its very nature. The hook may deform easily when subject to vibration, for example, to thereby cause the rear and front metal fins to become loosed. Thus, the metal fins cannot be firmly combined with each other.

Therefore, it is desirable to provide a heat sink wherein one or more of the foregoing disadvantages can be overcome or at least alleviated.

SUMMARY OF INVENTION

The present invention relates, in one aspect, to a heat sink which can be suitably used for dissipating heat from a heat generating electronic component. According to an embodiment, the heat sink includes a first metal fin and a second metal fin interlocked with each other. Each of the first and second metal fins comprises a main plate made of a metal, a flange extending forwardly from the main plate, a protruding finger extending further forwardly from the flange and being aligned with a hole defined in the flange and located below the protruding finger, and a controlling member formed from the main plate beneath the flange and being aligned with the protruding finger for securing a fitting and tight engagement between the first and second metal fins. The protruding finger includes a connecting tab and a locking tab. The connecting tab interconnects the flange with the locking tab. The locking tab is curved inwardly from the connecting tab towards the main plate. The locking tab of the first metal fin is received in the hole of the second metal fin and fittingly abuts with the controlling member of the second metal fin so as to interlock the first and second metal fins together.

The present invention relates, in another aspect, to a method for producing such a heat sink. According to an embodiment, the method comprises steps of: (1) providing first and second metal fins, each of the first and second metal fins including a main plate, a protruding finger being located at a side of the main plate, the protruding finger including a connecting tab extending from and being located aslant with respect to the main plate, and a locking tab extending from and forming an angle with respect to the connecting tab, a controlling member being formed from the main plate and being aligned with the protruding finger, a hole being defined in the hole and being aligned with the protruding finger and located between the controlling member and the protruding finger; (2) erecting a flange from the main plate along a direction between the hole and the controlling member so that the protruding finger is outwardly expanded relative to the flange; (3) stacking the first and second metal fins with each other to cause the outwardly expanded protruding finger of the first metal fin to correspond to the hole of the second metal fin; and (4) pressing the outwardly expanded protruding finger of the first metal fin towards the hole of the second fin to bring the locking tab of the protruding finger of the first metal fin to enter into the hole and to fittingly abut with the controlling member of the second fin so as to interlock the first and second metal fins together.

Other advantages and novel features of the present invention will become more apparent from the following detailed description of preferred embodiment(s) when taken in conjunction with the accompanying drawings, in which:

DETAILED DESCRIPTION

Figure 1:
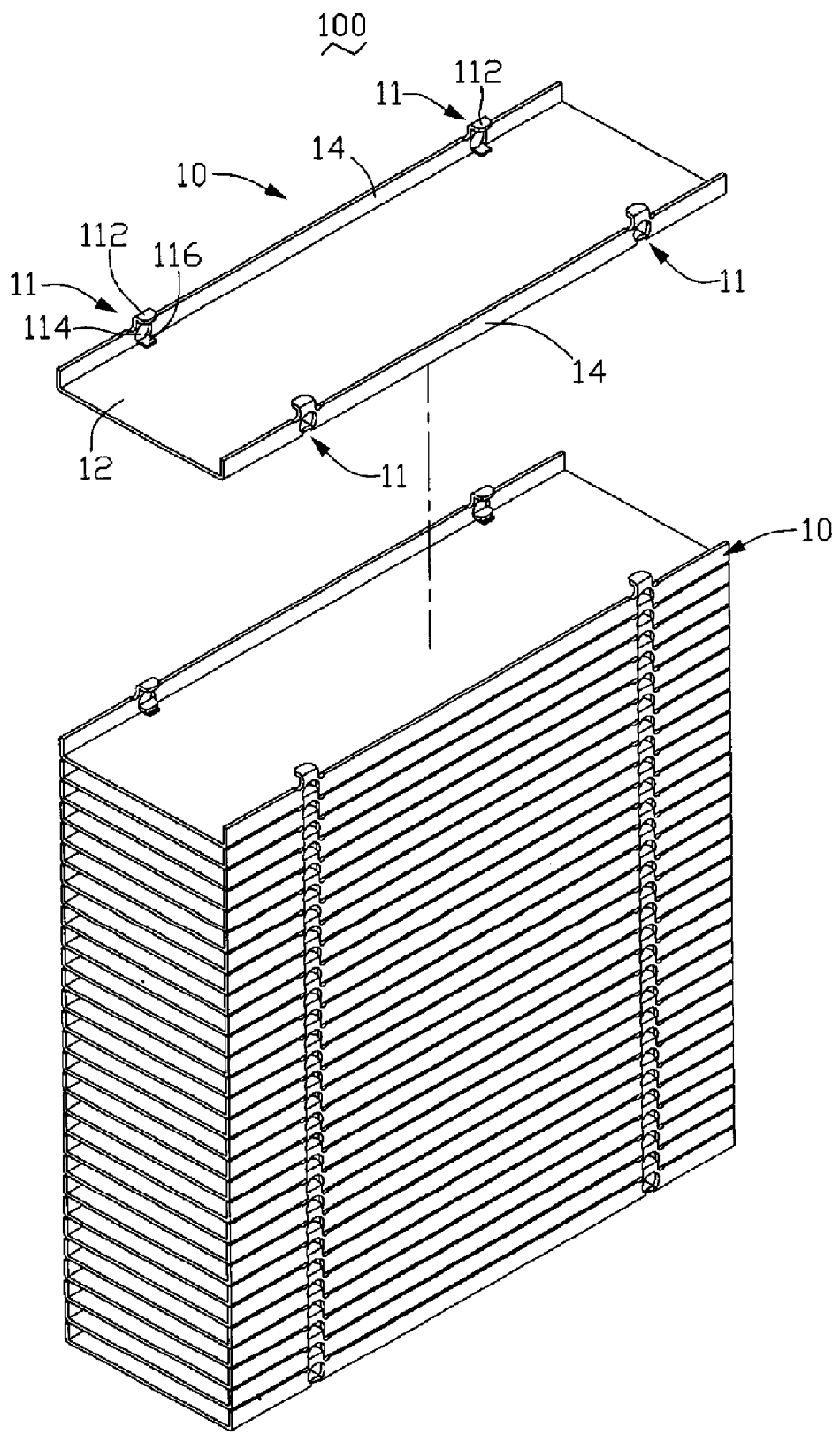
FIG. 1 is a partially exploded, isometric view of a heat sink in accordance with an embodiment of the present invention.
Figure 2:
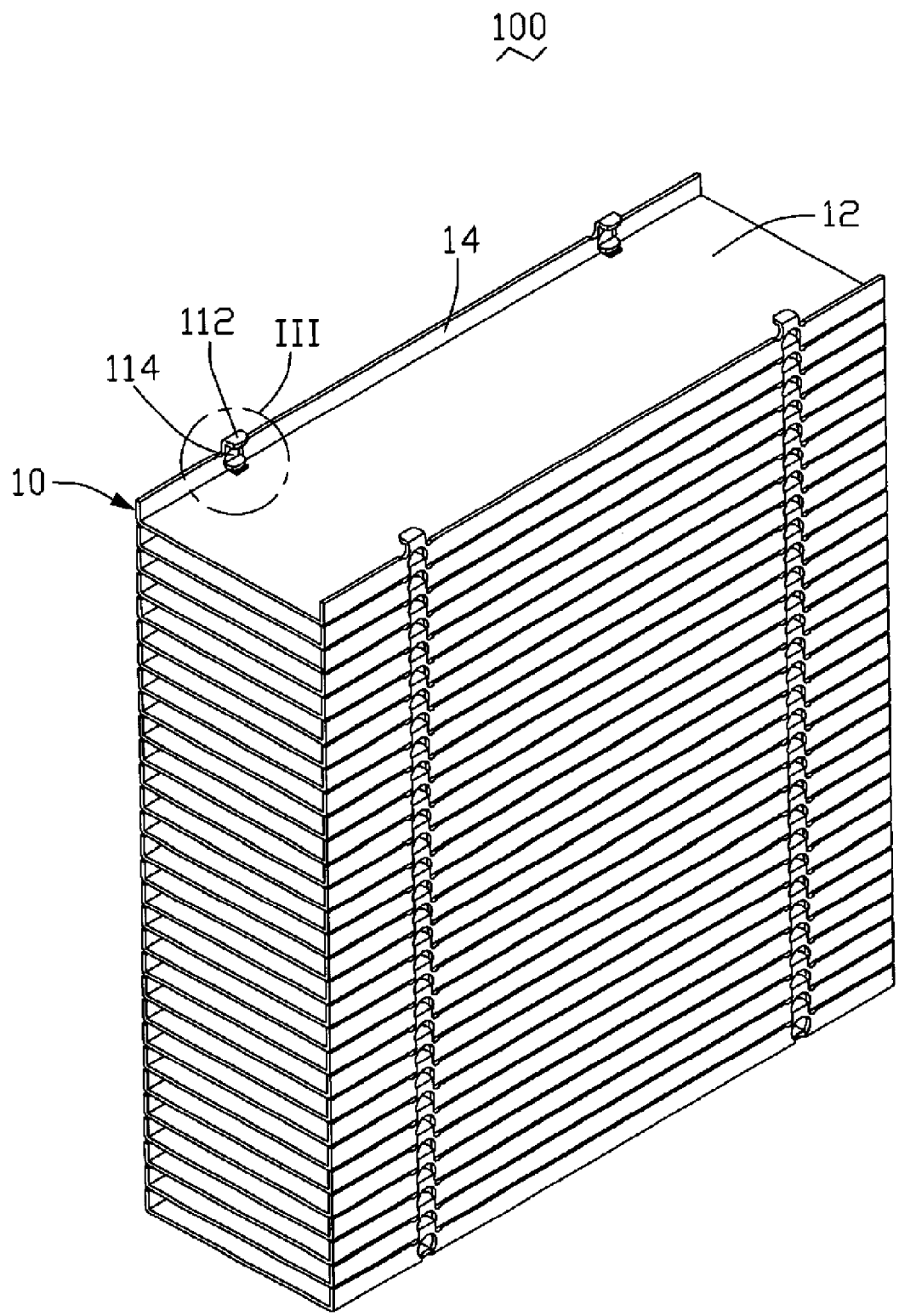
FIG. 2 is an assembled view of the heat sink of FIG. 1.

FIG. 1 shows a heat sink 100 in accordance with an embodiment of the present invention. The heat sink 100 can be suitably used for dissipating heat from a heat generating electronic component such as a central processing unit (CPU) of a computer. The heat sink 100 includes a plurality of metal fins 10 combined with each other by using interlocking units 11 formed between these metal fins 10. The heat sink 100 is made of a highly thermally conductive metal such as copper, copper alloy, aluminum, aluminum alloy, or any other metals as considered desirable.

In this embodiment, each of the metal fins 10 is substantially U-shaped and includes a flat main plate 12 and a pair of flanges 14 each extending forwardly from one of a pair of opposite sides of the main plate 12. Selectively, each of the metal fins 10 can be substantially Z-shaped with a first flange extending forwardly from the main plate 12 and a second flange extending backwardly from the main plate 12. The main plate 12 is rectangular in profile and has a pair of longer sides and a pair of shorter sides. The flanges 14 extend from the longer sides of the main plate 12. Alternatively, the main plate 12 can be in the form of a square, a trapezoid, or any other shape under specific requirements. In addition to being flat, the main plate 12 can also be wave-shaped or has a plurality of projections formed thereon so as to further increase a total surface area available for heat dissipation. Each of the flanges 14 is perpendicular to the main plate 12 and has a length identical to a total length of each longer side of the main plate 12. Alternatively, the flange 14 can have a length smaller than a total length of each longer side of the main plate 12. The flange 14 can have a portion thereof being removed. For instance, a middle portion of each of the flanges 14 can be removed so that the flanges 14 are formed only at four corners of the metal fin 10. It is noted that, in addition to the flanges 14, additional other flange(s) can also be provided at the shorter side(s) of the main plate 12, as considered desirable.

In this embodiment, the metal fin 10 has four interlocking units 11 formed at the four corners of the metal fin 10, respectively. Each of the interlocking units 11 includes a protruding finger 112, a hole 114 and a bump 116. The protruding finger 112 is projected further forwardly from the flange 14. As particularly shown in FIG. 4, the protruding finger 112 includes a connecting tab 112a extending forwardly from the flange 14 and a locking tab 112b formed at a free end of the protruding finger 112. The connecting tab 112a interconnects the flange 14 with the locking tab 112b and is substantially located in a same plane with the flange 14. The locking tab 112b is curved inwardly from the connecting tab 112a towards the main plate 12 of the metal fin 10. The connecting tab 112a and the locking tab 112b cooperatively form a L-shaped profile. The hole 114 is defined in the flange 14 and is in alignment with the protruding finger 112. The hole 114 is rounded in profile. Selectively, the hole 114 can be in the form of a square, a rectangle, or any other suitable shape. The bump 116 is formed on the main plate 12 of the metal fin 10 beneath the flange 14 and is aligned with the protruding finger 112. The bump 116 is projected above the main plate 12 of the metal fin 10 and has a flat top surface 116a. The locking tab 112b has a planar inner surface 112c confronting with the flat top surface 116a of the bump 116.

Figure 3:
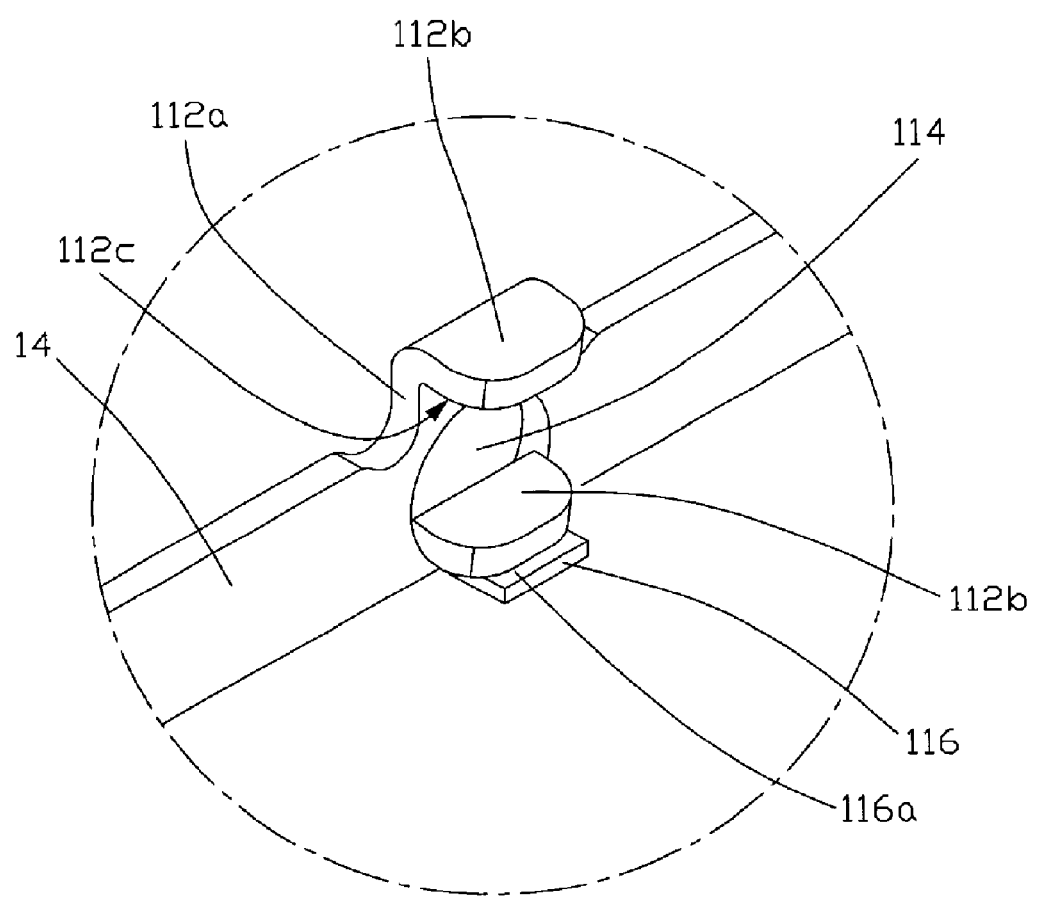
FIG. 3 is an enlarged view of the circled portion III of FIG. 2.
Figure 4:
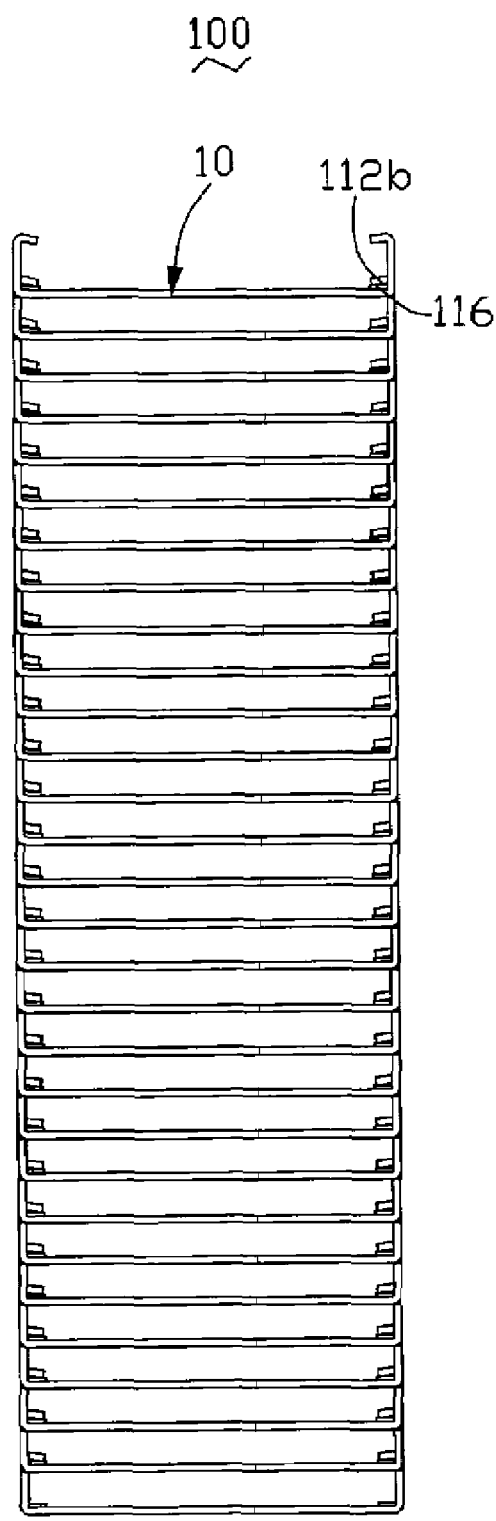
FIG. 4 is a side view of the heat sink of FIG. 2.

With reference now to FIGS. 1-4, in assembly, the locking tab 112b of each protruding finger 112 of a rear metal fin 10 extends into a corresponding hole 114 of a front metal fin 10 and the planar inner surface 112c of the locking tab 112b abuts on the flat top surface 116a of the corresponding bump 116 of the front metal fin 10, as shown in FIGS. 3 and 4. The flanges 14 of the rear metal fin 10 engage with the main plate 12 of the front metal fin 10 to thereby maintain a fixed distance between the front and rear metal fins 10. The fixed distance acts as a channel for passage of convective air. In the present heat sink 100, the protruding finger 112 of the rear metal fin 10 is interlocked with the front metal fin 10 in the hole 114 of the front metal fin 10, and the locking tab 112b of the rear metal fin 10 fittingly abuts with the bump 116 of the front metal fin 10. The locking tab 112b has a relatively large contact surface with the bump 116. Thus, the metal fins 10 of the present heat sink 100 are capable of being securely combined with each other and do not disassemble easily when subject to vibration.

Figure 5:
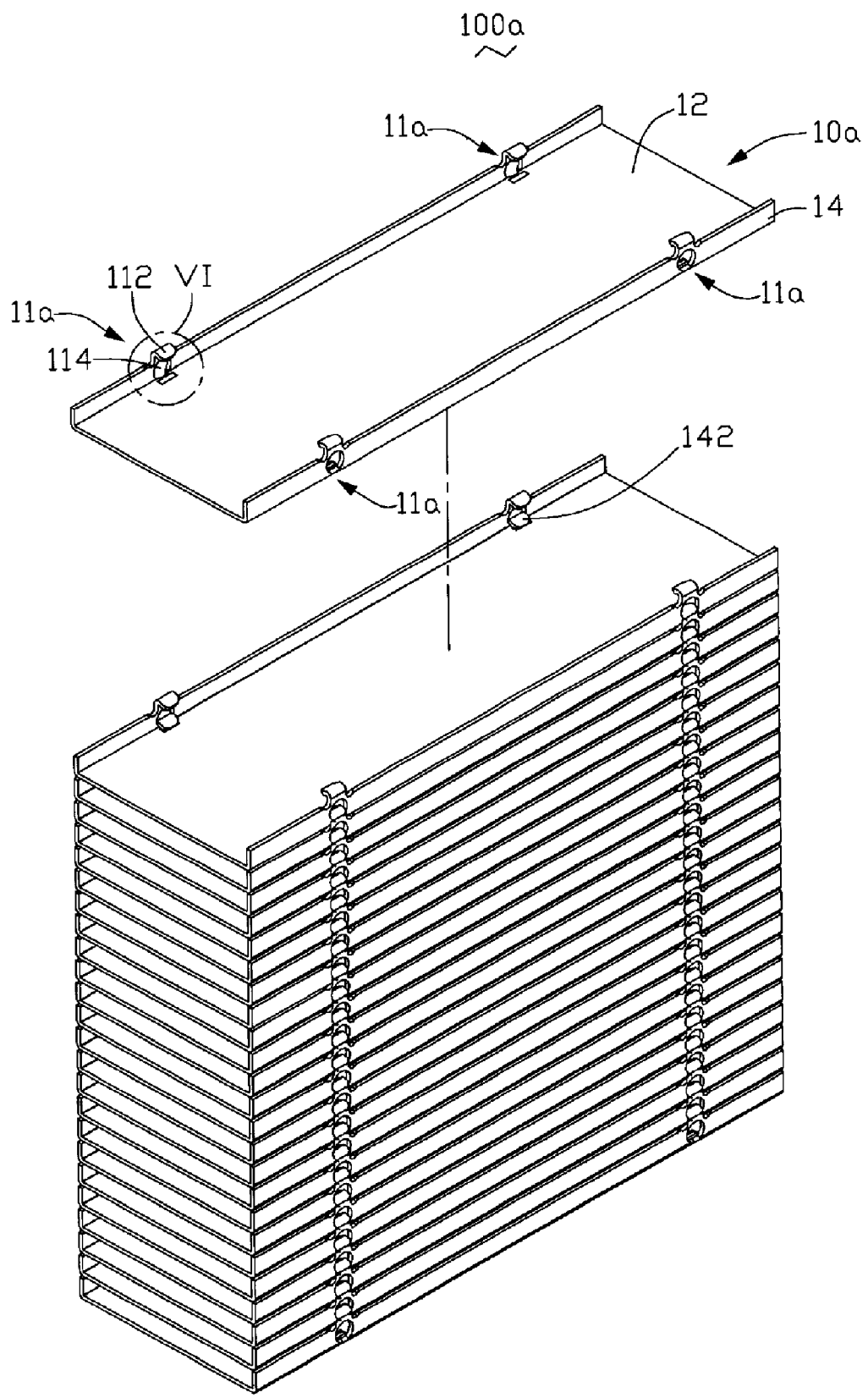
FIG. 5 is a partially exploded, isometric view of a heat sink in accordance with an alternative embodiment of the present invention.
Figure 6:
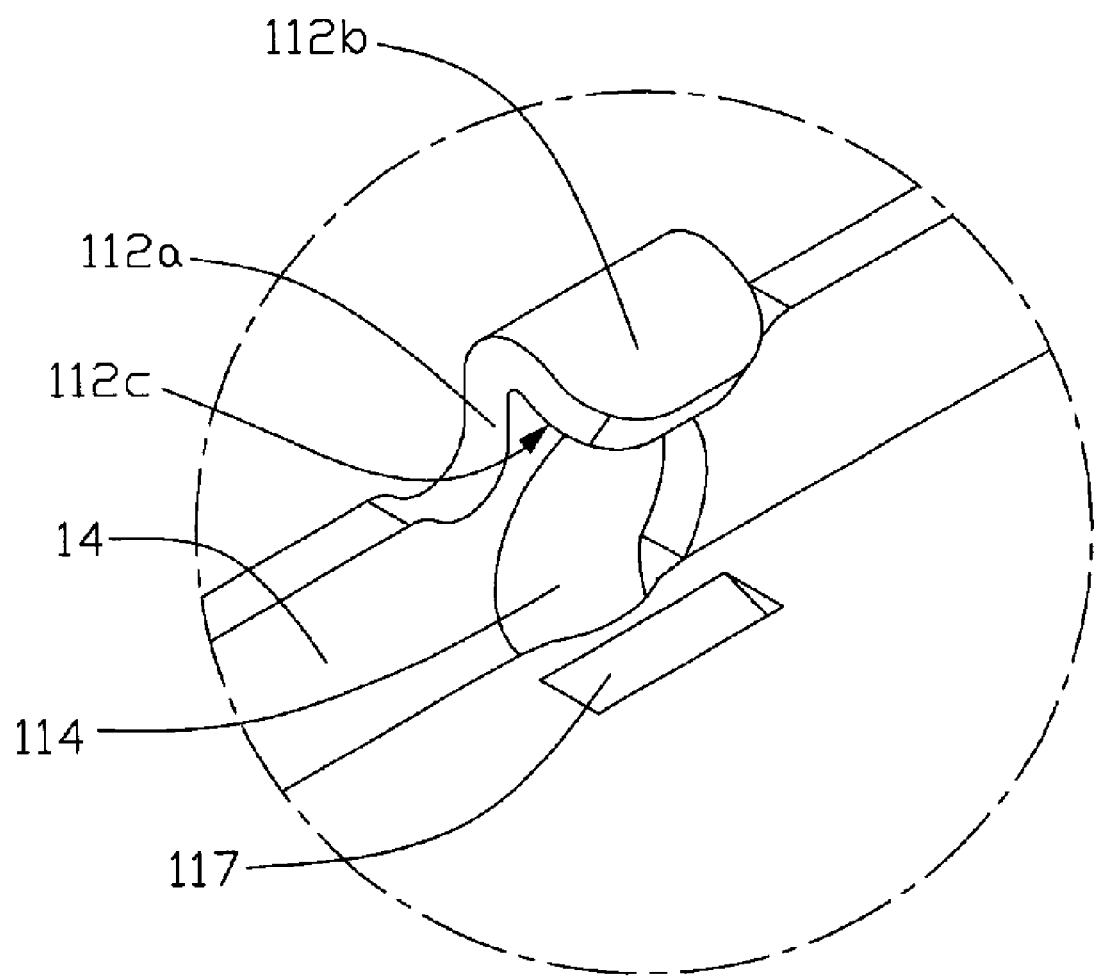
FIG. 6 is an enlarged view of the circled portion VI of FIG. 5.

FIGS. 5-6 show a heat sink 100a in accordance with an alternative embodiment of the present invention. In this embodiment, the interlocking unit 11a includes a protruding finger 112, a hole 114 and a recess 117. The connecting tab 112a interconnects the flange 14 with the locking tab 112b and is substantially located in a same plane with the flange 14. The locking tab 112b is curved inwardly from the connecting tab 112a towards the main plate 12 of the metal fin 10a. The connecting tab 112a and the locking tab 112b of the protruding finger 112 cooperatively form a V-shaped profile. The recess 117 is aligned with the protruding finger 112 and is defined in the main plate 12 of the metal fin 10a beneath the flange 14. The recess 117 substitutes for the bump 116 of the embodiment as shown in FIG. 1. As particularly shown in FIG. 6, the recess 117 has a depth which increases in respect to an increase of distance from the flange 14 to the recess 117. In other words, the depth of the recess 117 is gradually increased along a direction from the flange 14 toward a middle of the main plate 12. In assembly, the locking tab 112b of each protruding finger 112 of a rear metal fin 10a extends into a corresponding hole 114 of a front metal fin 10a. The locking tab 112b of the rear metal fin 10a is fittingly received in the corresponding recess 117 of the front metal fin 10a, and the planar inner surface 112c of the locking tab 112b abuts with the main plate 12 of the front metal fin 10a in the recess 117. In the present heat sink 100a, the protruding finger 112 of the rear metal fin 10a is interlocked with the front metal fin 10a and the locking tab 112b of the rear metal fin 10a is firmly positioned in the recess 117 of the front metal fin 10a, thereby securely combining the rear and front metal fins 10a together.

Figure 7:
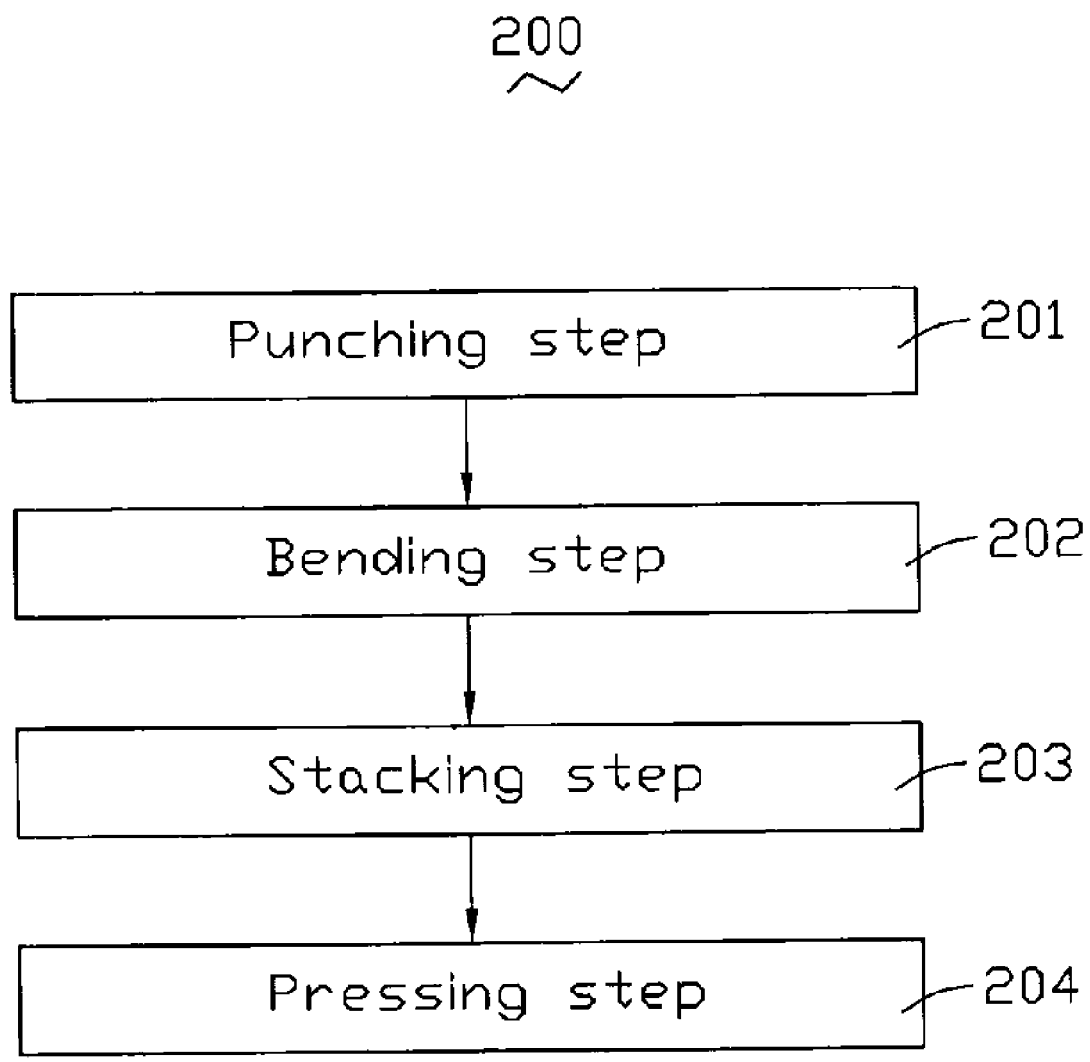
FIG. 7 is a flow chart showing a preferred method for producing the present heat sink.

FIG. 7 shows a method 200 for producing the heat sink 100 or the heat sink 100a. For the benefit of readers of the disclosure and by way of example, FIGS. 8-11 show different stages of the method 200 in producing the heat sink 100a, although the method 200 is also suitable for manufacture of the heat sink 100.

Figure 8:
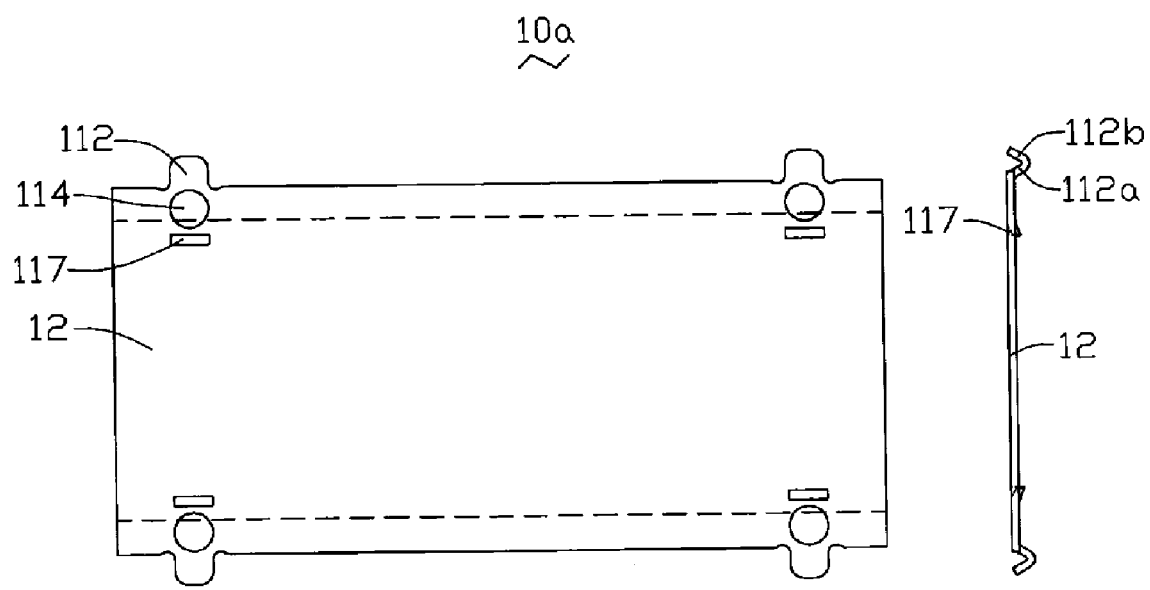
FIG. 8 is a view showing a first step in producing the heat sink of FIG. 5.

In step 201, a metal sheet is continually punched to provide a plurality of metal fins 10a. Each of the metal fins 10a is further punched to form the protruding fingers 112, the holes 114 and the recesses 117, as shown in FIG. 8. The connecting tab 112a of each of the protruding fingers 112 is located aslant with respect to the main plate 12 of the metal fin 10a. The connecting tab 112a and the locking tab 112b of each of the protruding finger 112 cooperatively form a V-shaped profile.

Figure 9:
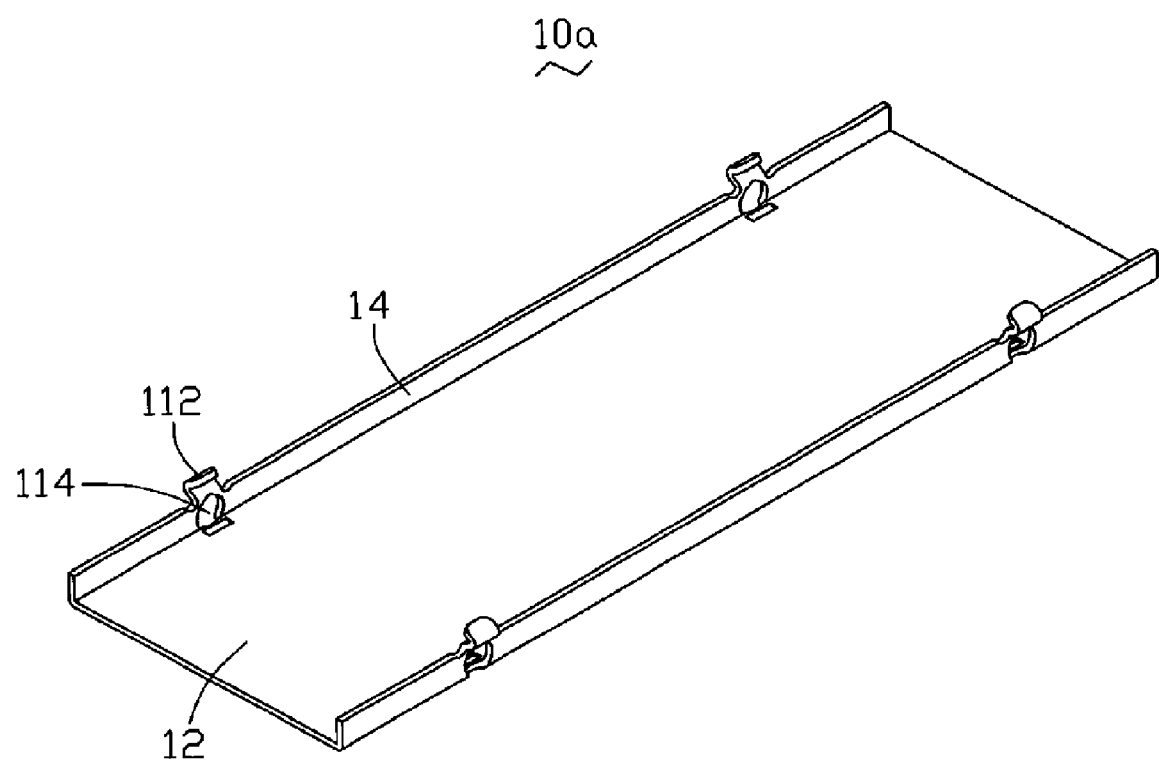
FIG. 9 is a view showing a second step in producing the heat sink of FIG. 5.

In step 202, the main plate 12 of the metal fin 10a is bent along the broken lines as shown in FIG. 8 to erect the flanges 14, wherein each of the broken lines is located near to a longer side of the main plate 12 and is located between the holes 114 and the recesses 117 near the longer side. After the flanges 14 are erected, the protruding fingers 112 are outwardly expanded relative to the flanges 14, as shown in FIG. 9.

Figure 10:
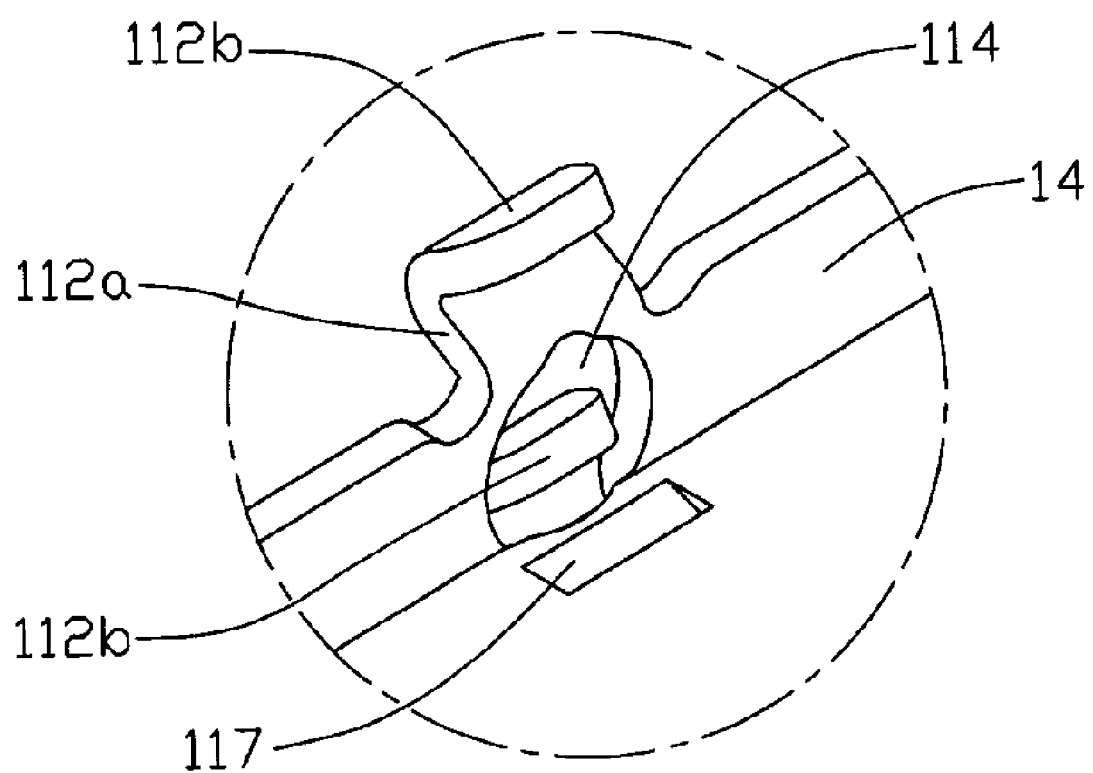
FIG. 10 is a view showing a third step in producing the heat sink of FIG. 5.

In step 203, a rear metal fin 10a and a front metal fin 10a are stacked with each other, with the outwardly expanded protruding fingers 112 of the rear metal fin 10a positioned correspondingly to the holes 114 of the front metal fin 10a, as shown in FIG. 10.

Figure 11:
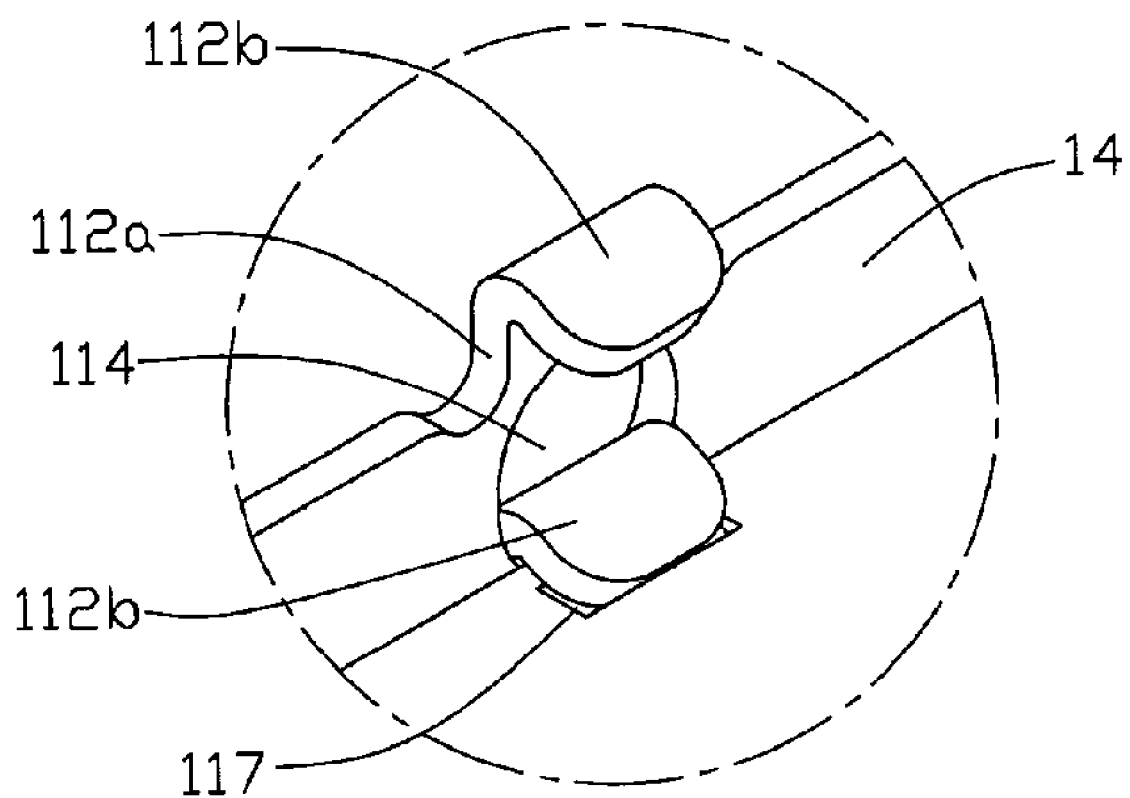
FIG. 11 is a view showing a final step in producing the heat sink of FIG. 5.

In step 204, the outwardly expanded protruding fingers 112 of the rear metal fin 10a are pressed towards the holes 114 of the front metal fin 10a to bring the locking tabs 112b of the protruding fingers 112 of the rear metal fin 10a to enter into the holes 114 and to be fittingly and firmly received in the recess 117 of the front metal fin 10a, as shown in FIG. 11.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A heat sink including a first metal fin and a second metal fin interlocked with each other, each of the first and second metal fins comprising:
    a main plate made of a metal;
    a flange extending forwardly from the main plate, the flange defining a hole therein;
    a protruding finger extending further forwardly from the flange and being aligned with said hole, including a connecting tab and a locking tab, the connecting tab interconnecting the flange with the locking tab, the locking tab being curved inwardly from the connecting tab towards the main plate; and
    a controlling member formed from the main plate beneath the flange and being aligned with the protruding finger for securing a fitting and tight engagement between the first and second metal fins; wherein
    the locking tab of the first metal fin is received in the hole of the second metal fin and fittingly abuts with the controlling member of the second metal fin so as to interlock the first and second metal fins together.

2. The heat sink according to claim 1, wherein the controlling member is a bump projected above the main plate.

3. The heat sink according to claim 2, wherein the bump has a flat top surface and the locking tab has a planar inner surface, the planar inner surface of the locking tab abutting with the flat top surface of the bump.

4. The heat sink according to claim 2, wherein the connecting tab and the locking tab cooperatively form a L-shaped profile.

5. The heat sink according to claim 1, wherein the controlling member is a recess defined in the main plate.

6. The heat sink according to claim 5, wherein the recess has a depth which increases in respect to an increase of distance from the flange to the recess.

7. The heat sink according to claim 5, wherein the connecting tab and the locking tab cooperatively form a V-shaped profile.

8. The heat sink according to claim 1, wherein the flange is substantially perpendicular to the main plate, and an additional flange extends perpendicularly from the main plate so that each of the first and second metal fins is substantially U-shaped.

9. A method for producing a heat sink, comprising steps of:
    providing first and second metal fins, each of the first and second metal fins including a main plate, a protruding finger being located at a side of the main plate, the protruding finger including a connecting tab extending from and being located aslant with respect to the main plate, and a locking tab extending from and forming an angle with respect to the connecting tab, a controlling member being formed from the main plate and being aligned with the protruding finger, a hole being defined in the main plate and being aligned with the protruding finger and located between the controlling member and the protruding finger;
    erecting a flange from the main plate along a position between the hole and the controlling member in which the protruding finger is outwardly expanded relative to the flange;
    stacking the first and second metal fins with each other to cause the outwardly expanded protruding finger of the first metal fin to be positioned corresponding to the hole of the second metal fin; and
    pressing the outwardly expanded protruding finger of the first metal fin towards the hole of the second fin to bring the locking tab of the protruding finger of the first metal fin to enter into the hole and to fittingly abut with the controlling member of the second fin so as to interlock the first and second metal fins together.

10. The method according to claim 9, wherein the controlling member is a bump projected above the main plate.

11. The method according to claim 10, wherein the bump has a flat top surface and the locking tab has a planar inner surface, the planar inner surface of the locking tab abutting with the flat top surface of the bump.

12. The method according to claim 10, wherein the connecting tab and the locking tab cooperatively form a L-shaped profile.

13. The method according to claim 9, wherein the controlling member is a recess defined in the main plate.

14. The method according to claim 13, wherein the recess has a depth which increases gradually along a direction from the flange toward a middle of the main plate.

15. The method according to claim 13, wherein the connecting tab and the locking tab cooperatively form a V-shaped profile.

* * * * *